United States Patent
Satoh et al.

(10) Patent No.: US 12,335,685 B2
(45) Date of Patent: Jun. 17, 2025

(54) VIBRATION DEVICE

(71) Applicant: TDK CORPORATION, Tokyo (JP)

(72) Inventors: Akira Satoh, Tokyo (JP); Kaoru Kijima, Tokyo (JP)

(73) Assignee: TDK CORPORATION, Tokyo (JP)

(*) Notice: Subject to any disclaimer, the term of this patent is extended or adjusted under 35 U.S.C. 154(b) by 326 days.

(21) Appl. No.: 18/079,346

(22) Filed: Dec. 12, 2022

(65) Prior Publication Data

US 2023/0232161 A1 Jul. 20, 2023

(30) Foreign Application Priority Data

Jan. 17, 2022 (JP) .................. 2022-004948

(51) Int. Cl.
*H04R 25/00* (2006.01)
*H04R 1/02* (2006.01)
*H04R 17/00* (2006.01)
*H10N 30/87* (2023.01)
*H10N 30/88* (2023.01)

(52) U.S. Cl.
CPC ............ *H04R 17/00* (2013.01); *H04R 1/025* (2013.01); *H10N 30/875* (2023.02); *H10N 30/88* (2023.02)

(58) Field of Classification Search
CPC ................ H04R 1/025; H04R 17/00
USPC ........................................... 381/190
See application file for complete search history.

(56) References Cited

U.S. PATENT DOCUMENTS

2013/0094681 A1 4/2013 Fukuoka et al.
2014/0314255 A1 10/2014 Fukuoka et al.

FOREIGN PATENT DOCUMENTS

JP 2015-133750 A 7/2015
WO WO-2020100824 A1 * 5/2020
WO WO-2020100828 A1 * 5/2020

OTHER PUBLICATIONS

WO 2020100828 A1. Translation (Year: 2020).*
WO 2020100824 A1. Translation (Year: 2020).*

* cited by examiner

*Primary Examiner* — Phylesha Dabney
(74) *Attorney, Agent, or Firm* — Oliff PLC

(57) ABSTRACT

A vibration device includes: a piezoelectric unit including a piezoelectric element; and a housing made of metal that holds the piezoelectric unit. The housing includes a bottom surface portion to which the piezoelectric unit is fixed, and side surface portions that stand at an edge portion of the bottom surface portion to surround the piezoelectric unit. The side surface portions are continuous with the bottom surface portion, and are inclined to open outward from the edge portion with respect to the bottom surface portion.

17 Claims, 3 Drawing Sheets

VIBRATION DEVICE

TECHNICAL FIELD

The present disclosure relates to a vibration device.

BACKGROUND

As a vibration device of the related art, for example, there is an acoustic generator described in Japanese Unexamined Patent Publication No. 2015-133750. The acoustic generator of the related art includes a film; a frame member provided at an outer peripheral portion of the film; a piezoelectric element provided on the film; and a resin layer with which a frame of the frame member is filled so as to cover the piezoelectric element.

SUMMARY

The vibration device described above is characterized by obtaining a desired acoustic characteristic in vibration of a housing. For this reason, a technical issue is to study a configuration of the housing and to improve an acoustic characteristic.

The present disclosure is conceived to solve the foregoing problem, and an object of the present disclosure is to provide a vibration device in which an acoustic characteristic is improved.

A vibration device according to one aspect of the present disclosure includes: a piezoelectric unit including a piezoelectric element; and a housing made of metal that holds the piezoelectric unit. The housing includes a bottom surface portion to which the piezoelectric unit is fixed, and side surface portions that stand at an edge portion of the bottom surface portion to surround the piezoelectric unit. The side surface portions are continuous with the bottom surface portion, and are inclined to open outward from the edge portion with respect to the bottom surface portion.

In the vibration device, the housing that holds the piezoelectric unit is made of metal. The side surface portions surrounding the piezoelectric unit are continuous with the bottom surface portion, and are inclined to open outward with respect to the bottom surface portion. With such a configuration, vibration can be efficiently transmitted to the side surface portions from the bottom surface portion on which the piezoelectric unit is disposed, and vibration of the bottom surface portion and vibration of the side surface portions can be sufficiently extracted as an output. Therefore, an acoustic characteristic is improved.

Both an inner surface and an outer surface of each of the side surface portions may be inclined with respect to the bottom surface portion. In this case, a thickness of the side surface portions can be suppressed as a whole, and the transmission efficiency of vibration from the bottom surface portion to the side surface portions can be increased. Therefore, the acoustic characteristics can be further improved.

Both a ridge portion of the piezoelectric element and a connection portion between the bottom surface portion and the side surface portion may have a curved shape. A curvature radius of the connection portion may be larger than a curvature radius of the ridge portion of the piezoelectric element. Accordingly, the transmission efficiency of vibration from the bottom surface portion to the side surface portions can be increased. In addition, a height of the side surface portions with respect to the bottom surface portion can be suppressed while ensuring an area of the side surface portions required for vibration. This contributes to a reduction in a height of the vibration device.

The piezoelectric unit may have a rectangular shape in a plan view. The bottom surface portion may have a trapezoidal shape of which an upper base and a lower base are sides corresponding to long sides of the piezoelectric unit in a plan view. The upper base of the bottom surface portion may be shorter than the long sides of the piezoelectric unit. The lower base of the bottom surface portion may be longer than the long sides of the piezoelectric unit. With such a configuration, an acoustic characteristic particularly in a high frequency range is improved.

A distance between the lower base of the bottom surface portion and the long side of the piezoelectric unit along the lower base may be shorter than short sides of the piezoelectric unit. With such a configuration, an acoustic characteristic particularly in a high frequency range is improved.

A first opening portion may be formed on a lower base side of the bottom surface portion by not providing the side surface portion. In this case, vibration can be efficiently extracted from the first opening portion.

A second opening portion may be formed on an upper base side of the bottom surface portion by cutting out a part of a top portion of the side surface portion. In this case, the second opening portion can be used as a lead-out port of a wiring member.

An opening area of the first opening portion may be larger than an opening area of the second opening portion. In this case, vibration can be preferentially extracted from the first opening portion with respect to the second opening portion. Therefore, both an improvement in acoustic characteristic and simplification of a layout of the wiring member and the like are achieved.

A flange portion that is directed outward may be provided on a top portion of each of the side surface portions. The easiness of attachment when the vibration device is attached to an external device can be enhanced by the flange portions.

A curvature radius of a connection portion between the side surface portion and the flange portion may be smaller than a curvature radius of a connection portion between the bottom surface portion and the side surface portion. Accordingly, transmission of vibration from the side surface portion to the flange portion can be suppressed. Therefore, the flange portion can be prevented from weakening vibration of the side surface portion. In addition, a reduction in attachment strength of the vibration device to the external device caused by vibration of the flange portion can be suppressed.

DETAILED DESCRIPTION

Hereinafter, an exemplary embodiment of a vibration device according to one aspect of the present disclosure will be described in detail with reference to the drawings.

Figure 1:
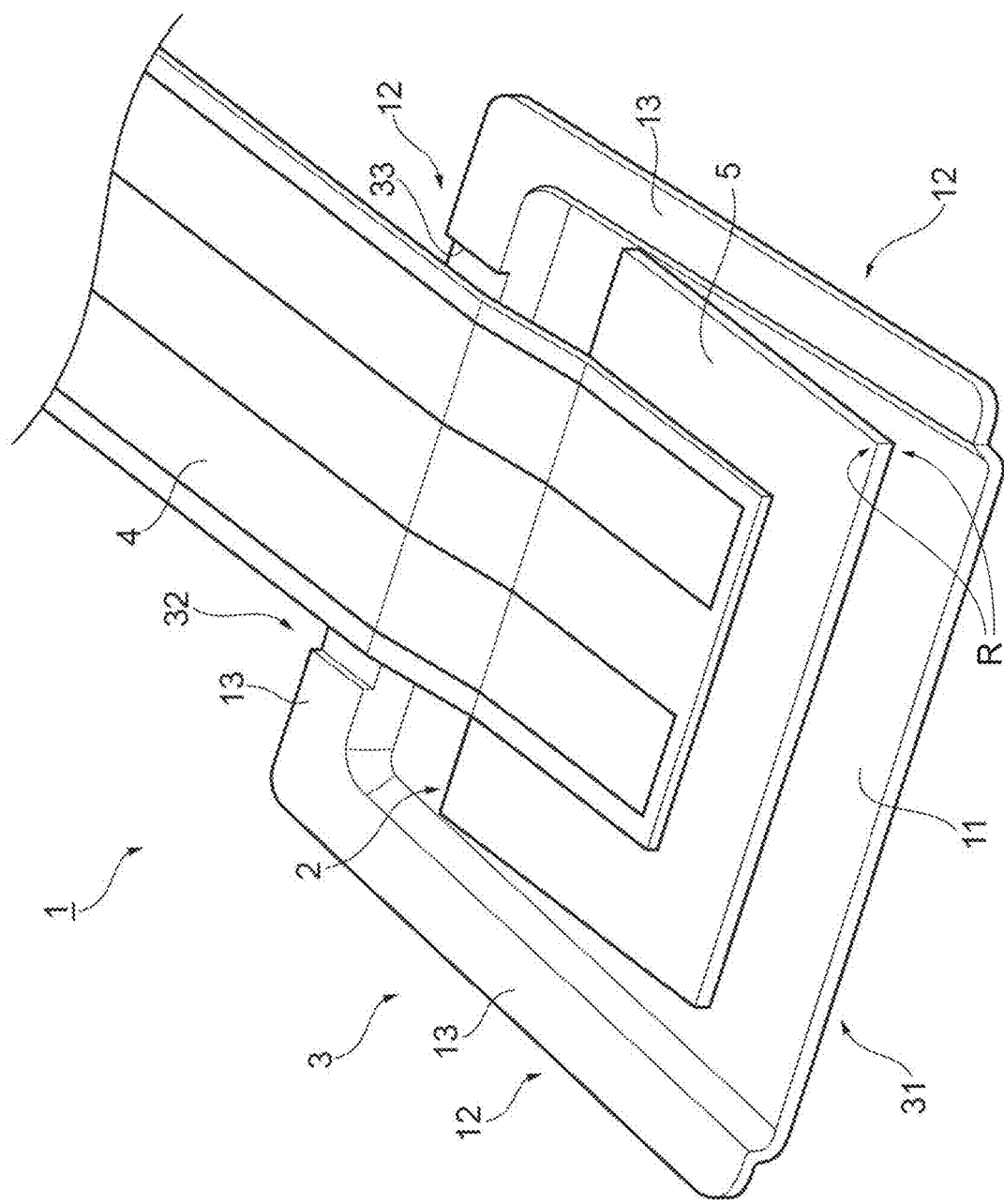
FIG. 1 is a perspective view illustrating one embodiment of a vibration device according to the present disclosure.

FIG. 1 is a perspective view illustrating one embodiment of a vibration device according to the present disclosure. A vibration device 1 is, for example, an acoustic device used as a speaker, a buzzer, or the like. As illustrated in FIG. 1, the vibration device 1 includes a piezoelectric unit 2, a housing 3, and a wiring member 4.

The piezoelectric unit 2 includes a piezoelectric element 5. The piezoelectric element 5 includes a piezoelectric element body and a pair of external electrodes. The piezoelectric element 5 has a rectangular parallelepiped shape that is flat in a thickness direction. The rectangular parallelepiped shape can also include a shape of which angular portions and ridge portions R are chamfered, and a shape of which angular portions and ridge portions are rounded. The piezoelectric element body is formed of a laminate of a plurality of piezoelectric layers. Each of the piezoelectric layers is made of a piezoelectric material such as piezoelectric ceramic. Examples of the piezoelectric ceramic material include PZT[Pb(Zr,Ti)O$_3$], PT(PbTiO$_3$), PLZT[(Pb,La)(Zr, Ti)O$_3$], barium titanate (BaTiO$_3$), and the like.

Each of the piezoelectric layers is formed of, for example, a sintered body of ceramic green sheets containing the above-described piezoelectric ceramic. In the actual piezoelectric element body, the piezoelectric layers are integrated to an extent that boundaries between the piezoelectric layers cannot be recognized. A plurality of internal electrodes (not illustrated) are disposed inside the piezoelectric element body. Each of the internal electrodes is made of a conductive material. Examples of the conductive material include Ag, Pd, an Ag—Pd alloy, and the like.

The piezoelectric unit 2 may be configured such that a vibration plate is combined with the piezoelectric element 5. The vibration plate is a plate-shaped member made of, for example, a metal material. Examples of the metal material forming the vibration plate include a Ni—Fe alloy, Ni, brass, stainless steel, and the like. The vibration plate has, for example, a rectangular shape. The vibration plate is disposed on a bottom surface (surface on a housing 3 side) side of the piezoelectric element 5, and can be fixed to the piezoelectric element 5 and to the housing 3 using, for example, an adhesive material, double-sided tape, or the like.

The housing 3 is a member that holds the piezoelectric unit 2. The housing 3 is shaped, for example, by pressing working of metal. Examples of the metal material forming the housing 3 include stainless steel, aluminum, a 42Ni alloy, and the like. The housing 3 includes a bottom surface portion 11 and a plurality of side surface portions 12. The bottom surface portion 11 is a portion to which the piezoelectric unit 2 described above is fixed. The side surface portions 12 stand at an edge portion of the bottom surface portion 11 to surround the piezoelectric unit 2.

A flange portion 13 that is directed outward is provided on a top portion 12a of each of the side surface portions 12. The flange portion 13 extends from the top portion 12a of the side surface portion 12 by a predetermined width so as to be parallel to the bottom surface portion 11. The flange portion 13 functions as an attachment portion for attaching the vibration device 1 to an external device. For example, one surface (surface opposite the bottom surface portion 11) of the flange portion 13 serves as an attachment surface on which an attachment member such as double-sided tape is provided. As the attachment member, an adhesive agent can also be used in addition to the double-sided tape.

The wiring member 4 is a member that electrically connects the piezoelectric unit 2 and the external device. The wiring member 4 is, for example, a flexible printed circuit (FPC) board. One end of the wiring member 4 is electrically connected to each of the pair of external electrodes of the piezoelectric element 5. For example, an anisotropic conductive adhesive material can be used to connect the one end of the wiring member 4 and the external electrodes of the piezoelectric element 5. The other end (not illustrated) of the wiring member 4 is electrically connected to the external device.

Next, a configuration of the housing 3 described above and a disposition relationship between the piezoelectric unit 2 and the housing 3 will be described in further detail.

Figure 2:
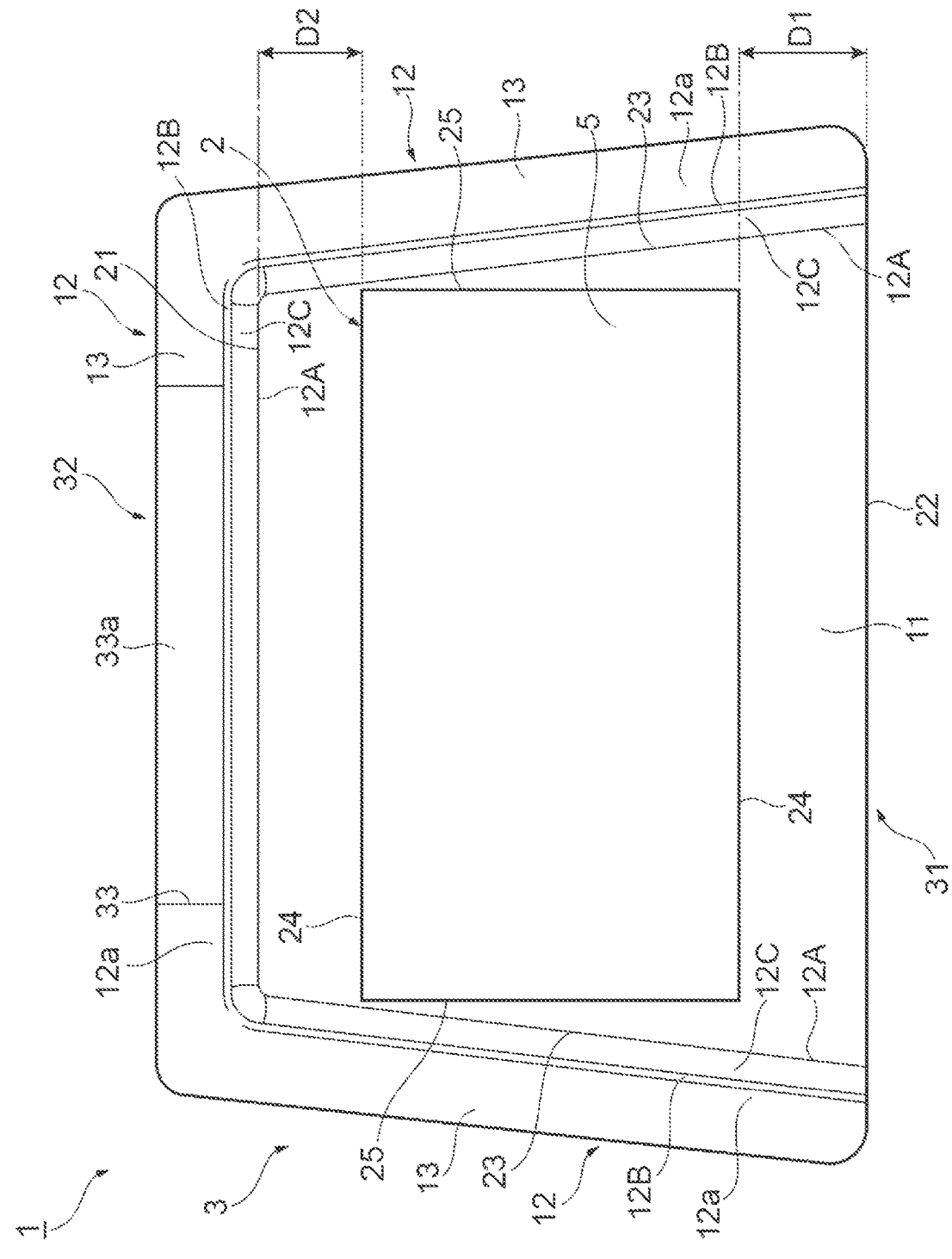
FIG. 2 is a plan view of the vibration device illustrated in FIG. 1.
Figure 3:
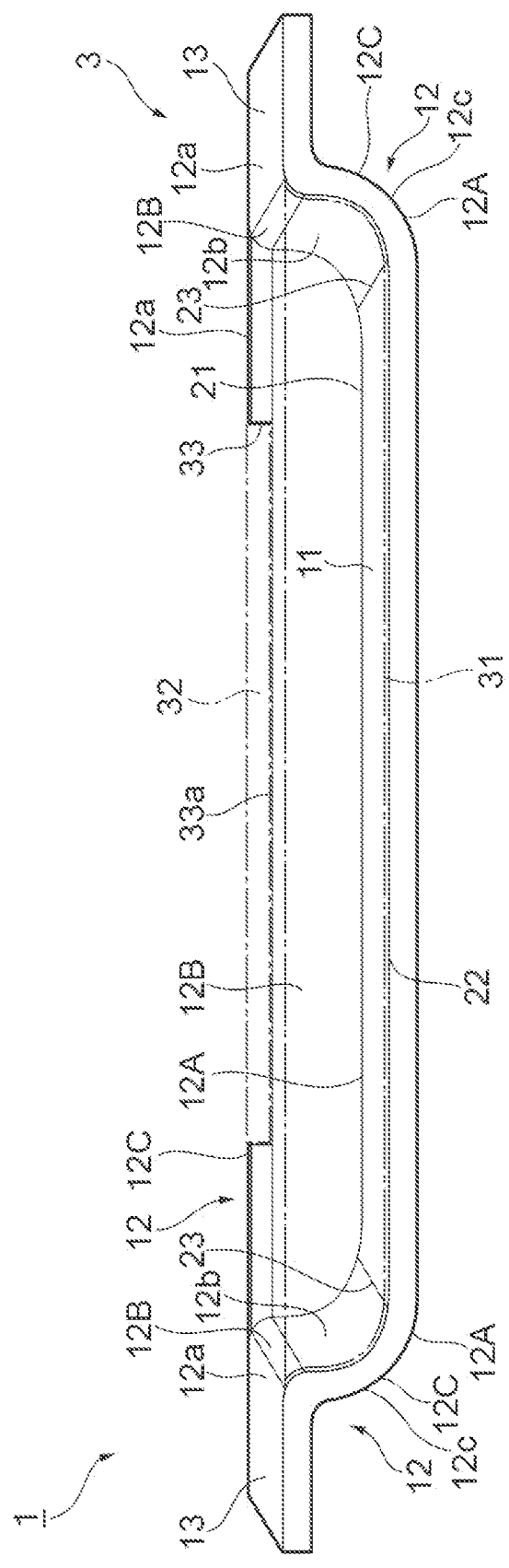
FIG. 3 is a front view of the vibration device illustrated in FIG. 1.

FIG. 2 is a plan view of the vibration device illustrated in FIG. 1, and FIG. 3 is a front view of the vibration device. In FIGS. 2 and 3, for convenience of description, the illustration of the wiring member 4 is omitted. In FIG. 3, the illustration of the piezoelectric unit 2 is further omitted. As illustrated in FIGS. 2 and 3, in the present embodiment, the piezoelectric unit 2 has a rectangular shape in a plan view. A plan shape of the piezoelectric unit 2 is a plan shape of the piezoelectric element 5 when the piezoelectric unit 2 is formed of only the piezoelectric element 5, and is a plan shape of the vibration plate when the piezoelectric unit is formed of the piezoelectric element 5 and the vibration plate.

The bottom surface portion 11 of the housing 3 has a trapezoidal shape in a plan view. Namely, the bottom surface portion 11 has an upper base 21, a lower base 22, and a pair of oblique sides 23 and 23. Here, as illustrated in FIG. 2, a plan shape of the bottom surface portion 11 is an isosceles trapezoidal shape. The lower base 22 of the bottom surface portion 11 is larger than the upper base 21. Namely, the bottom surface portion 11 widens from the upper base 21 toward the lower base 22. The piezoelectric unit 2 is disposed on a substantially center portion of the bottom surface portion 11. The bottom surface portion 11 is a main vibration portion of the housing 3, and vibration caused by the piezoelectric unit 2 is directly transmitted to the bottom surface portion 11.

The upper base 21 and the lower base 22 of the bottom surface portion 11 extend along long sides 24 of the piezoelectric unit 2 in a plan view. The upper base 21 of the bottom surface portion 11 is shorter than the long sides 24 of the piezoelectric unit 2, and the lower base 22 of the bottom surface portion 11 is longer than the long sides 24 of the piezoelectric unit 2. A constant distance D1 is provided between the lower base 22 of the bottom surface portion 11 and the long side 24 of the piezoelectric unit 2. The distance D1 is shorter than short sides 25 of the piezoelectric unit 2. Similarly, a constant distance D2 is provided between the upper base 21 of the bottom surface portion 11 and the long side 24 of the piezoelectric unit 2. The distance D2 is shorter than the short sides 25 of the piezoelectric unit 2. In the present embodiment, the distance D1 is equal to or larger than the distance D2. The distance D1 may be less than the distance D2.

The side surface portions 12 are provided to correspond to the upper base 21 and the pair of oblique sides 23 and 23 of the bottom surface portion 11. A height of the side surface portions 12 is larger than a thickness of the piezoelectric unit 2. Accordingly, the piezoelectric unit 2 disposed on the bottom surface portion 11 is surrounded by the side surface portions 12 in three directions, except for a lower base 22 side. The side surface portions 12 are smoothly continuous with the bottom surface portion 11, and are inclined to open outward from the edge portion with respect to the bottom surface portion 11. The side surface portions 12 are sub-vibration portions of the housing 3, and vibration caused by the piezoelectric unit 2 is transmitted to the side surface portions 12 via the bottom surface portion 11.

Each of the side surface portions 12 includes a connection portion 12A connected to the bottom surface portion 11; a connection portion 12B connected to the flange portion 13; and an intermediate portion 12C located between the connection portions 12A and 12B. In the present embodiment, as illustrated in FIG. 3, the connection portion 12A and the intermediate portion 12C have an integral arc cross-sectional shape that bulges toward the outside of the housing 3. In the present embodiment, thicknesses of the connection portion 12A and the intermediate portion 12C are the same as a thickness of the bottom surface portion 11 and are constant. For this reason, both an inner surface 12b and an outer surface 12c of the side surface portion 12 are gently curved and inclined with respect to the bottom surface portion 11.

When a curvature radius of a ridge portion of the piezoelectric element 5 is R1 and a curvature radius of the connection portion 12A is R2, the curvature radius R2 of the connection portion 12A is larger than the curvature radius R1 of the ridge portion of the piezoelectric element 5. A ratio between the curvature radius R1 and the curvature radius R2 is equal to or larger than, for example, 1:2. Since the curvature radius R2 is set to be larger than the curvature radius R1, the followability of the bottom surface portion 11 for vibration of the piezoelectric element 5 is enhanced, and a displacement of the bottom surface portion 11 is sufficiently ensured. As a result, sound pressure of the vibration device 1 is improved.

On the other hand, the connection portion 12B has an arc cross-sectional shape facing a side opposite the connection portion 12A and the intermediate portion 12C. In the present embodiment, a thickness of the connection portion 12B is are the same as the thicknesses of the bottom surface portion 11, the connection portion 12A, and the intermediate portion 12C and is constant. When a curvature radius of the connection portion 12B is R3, the curvature radius R3 of the connection portion 12B is smaller than the curvature radius R2 of the connection portion 12A. A relationship between the curvature radius R3 of the connection portion 12B and the curvature radius R1 of the ridge portion of the piezoelectric element 5 is not particularly limited. The curvature radius R3 of the connection portion 12B may be equal to or larger than the curvature radius R1 of the ridge portion of the piezoelectric element 5, or may be less than the curvature radius R1 of the ridge portion of the piezoelectric element 5.

A first opening portion 31 is formed on a lower base 22 side of the bottom surface portion 11 by not providing the side surface portion 12. As illustrated in FIG. 3, the first opening portion 31 is defined by the bottom surface portion 11, by the side surface portions 12 and 12 corresponding to the oblique sides 23 and 23 of the bottom surface portion 11, and by an imaginary line connecting one surfaces (attachment surfaces to the external device) of the flange portions 13 and 13 of the side surface portions 12 and 12. The first opening portion 31 functions as an extraction port for extracting vibration caused by the piezoelectric unit 2 to the outside in a state where the vibration device 1 is attached to the external device.

A second opening portion 32 is formed on an upper base 21 side of the bottom surface portion 11 by cutting out a part of the top portion 12a of the side surface portion 12. As illustrated in FIG. 3, the second opening portion 32 is defined by a cutout portion 33 formed in the side surface portion 12 corresponding to the upper base 21 of the bottom surface portion 11, and by an imaginary line connecting the top portions 12a and 12a of the side surface portions 12 that interpose the cutout portion 33 therebetween. A width of the cutout portion 33 is slightly larger than a width of the wiring member 4. A depth of the cutout portion 33 from the top portion 12a of the side surface portion 12 is the same as a thickness of the wiring member 4 or is slightly larger than the thickness thereof. The second opening portion 32 functions as a lead-out port of the wiring member 4 electrically connected to the piezoelectric unit 2, in a state where the vibration device 1 is attached to the external device.

A height of a bottom surface 33a of the cutout portion 33 with respect to the bottom surface portion 11 is higher than a height of the piezoelectric unit 2 (height of a top surface of the piezoelectric element 5) with respect to the bottom surface portion 11. The wiring member 4 is disposed to be inclined so as to gradually rise toward the cutout portion 33 between the piezoelectric unit 2 and the cutout portion 33, and a constant tensile force is applied to the wiring member 4.

In the present embodiment, an opening area S1 of the first opening portion 31 is larger than an opening area S2 of the second opening portion 32. Accordingly, vibration of the piezoelectric unit 2 can be preferentially extracted from the first opening portion 31. A frequency characteristic of the vibration device 1 is determined by a combination of the opening area S1 and the opening area S2. A resonance of the first opening portion 31 and a resonance of the second opening portion 32 are used to adjust a frequency characteristic of the entirety of the vibration device 1. Incidentally, angular portions and corner portions of the cutout portion 33 may have a chamfered shape or a rounded shape. An inner surface of the cutout portion 33 may be an inclined surface or a curved surface such that a width of the cutout portion 33 increases toward the top portion 12a of the side surface portion 12.

As described above, in the vibration device 1, the housing 3 that holds the piezoelectric unit 2 is made of metal. The side surface portions 12 surrounding the piezoelectric unit 2 are continuous with the bottom surface portion 11, and are inclined to open outward with respect to the bottom surface portion 11. With such a configuration, vibration can be efficiently transmitted to the side surface portions 12 from the bottom surface portion 11 on which the piezoelectric unit 2 is disposed, and vibration of the bottom surface portions 11 and vibration of the side surface portions 12 can be sufficiently extracted as an output. Therefore, an acoustic characteristic is improved.

In the vibration device 1, both the inner surface 12b and the outer surface 12c of the side surface portion 12 are inclined with respect to the bottom surface portion 11. Accordingly, the thickness of the side surface portions 12 can be suppressed as a whole, and the transmission efficiency of vibration from the bottom surface portion 11 to the side surface portions 12 can be increased. Therefore, the acoustic characteristics can be further improved.

In the vibration device 1, both the ridge portion of the piezoelectric unit 2 and the connection portion 12A between the bottom surface portion 11 and the side surface portion 12 have a curved shape, and the curvature radius R2 of the connection portion 12A is larger than the curvature radius R1 of the ridge portion of the piezoelectric element 5. Accordingly, the transmission efficiency of vibration from the bottom surface portion 11 to the side surface portions 12 can be increased. In addition, the height of the side surface portions 12 with respect to the bottom surface portion 11 can be suppressed while ensuring an area of the side surface portions 12 required for vibration. This contributes to a reduction in the height of the vibration device 1.

In the vibration device 1, the piezoelectric unit 2 has a rectangular shape in a plan view. In addition, the bottom surface portion 11 has a trapezoidal shape of which the upper base 21 and the lower base 22 are sides corresponding to the long sides 24 of the piezoelectric unit 2 in a plan view. Then, the upper base of the bottom surface portion 11 is shorter than the long sides 24 of the piezoelectric unit 2, and the lower base 22 of the bottom surface portion 11 is longer than the long sides 24 of the piezoelectric unit 2. In addition, in the vibration device 1, the distance D1 between the lower base 22 of the bottom surface portion 11 and the long side 24 of the piezoelectric unit 2 along the lower base 22 is shorter than the short sides 25 of the piezoelectric unit 2. According to such a configuration, an acoustic characteristic particularly in a high frequency range is improved.

In the vibration device 1, the first opening portion 31 is formed on the lower base 22 side of the bottom surface portion 11 by not providing the side surface portion 12. Accordingly, vibration can be efficiently extracted from the first opening portion 31. In addition, in the vibration device 1, the second opening portion 32 is formed on the upper base 21 side of the bottom surface portion 11 by cutting out a part of the top portion 12a of the side surface portion 12. Accordingly, the second opening portion 32 can be used as a lead-out port of the wiring member 4.

In the vibration device 1, the opening area S1 of the first opening portion 31 is larger than the opening area S2 of the second opening portion 32. Accordingly, vibration can be preferentially extracted from the first opening portion 31 with respect to the second opening portion 32. Therefore, both an improvement in acoustic characteristic and simplification of a layout of the wiring member 4 and the like are achieved.

In the vibration device 1, the flange portion 13 that is directed outward is provided on the top portion 12a of each of the side surface portions 12. The easiness of attachment when the vibration device 1 is attached to the external device can be enhanced by the flange portions 13.

In the vibration device 1, the curvature radius R3 of the connection portion 12B between the side surface portion 12 and the flange portion 13 is smaller than the curvature radius R2 of the connection portion 12A between the bottom surface portion 11 and the side surface portion 12. Accordingly, transmission of vibration from the side surface portion 12 to the flange portion 13 can be suppressed. Therefore, the flange portion 13 can be prevented from weakening vibration of the side surface portion 12. In addition, a reduction in attachment strength of the vibration device 1 to the external device caused by vibration of the flange portion 13 can be suppressed.

The present disclosure is not limited to the above embodiment. For example, in the above embodiment, a mode has been described in which the plan shape of the bottom surface portion 11 of the housing 3 is a trapezoidal shape, but the plan shape of the bottom surface portion 11 is not limited thereto, and may be other shapes such as a rectangular shape, a square shape, a circular shape, and an elliptical shape.

In addition, in the above embodiment, the connection portion 12A and the intermediate portion 12C have an integral arc cross-sectional shape, but only the connection portion 12A may have an arc cross-sectional shape and the intermediate portion 12C may be a flat inclined surface. In this case, an inclination angle of the intermediate portion 12C with respect to the bottom surface portion 11 can be set to, for example, 30° to 90°. Even in such a configuration, the side surface portions 12 are continuous with the bottom surface portion 11, and are inclined to open outward with respect to the bottom surface portion 11, so that the same actions and effects as those of the above configuration are obtained.

What is claimed is:

1. A vibration device comprising:
a piezoelectric unit including a piezoelectric element; and
a housing made of metal that holds the piezoelectric unit,
wherein the housing includes a bottom surface portion to which the piezoelectric unit is fixed, and side surface portions that stand at an edge portion of the bottom surface portion to surround the piezoelectric unit, and
the side surface portions are continuous with the bottom surface portion, and are inclined to open outward from the edge portion with respect to the bottom surface portion, wherein
both a ridge portion of the piezoelectric element and a connection portion between the bottom surface portion and the side surface portion have a curved shape, and
a curvature radius of the connection portion is larger than a curvature radius of the ridge portion of the piezoelectric element.

2. The vibration device according to claim 1,
wherein both an inner surface and an outer surface of each of the side surface portions are inclined with respect to the bottom surface portion.

3. The vibration device according to claim 1,
wherein the piezoelectric unit has a rectangular shape in a plan view,
the bottom surface portion has a trapezoidal shape of which an upper base and a lower base are sides corresponding to long sides of the piezoelectric unit in a plan view,
the upper base of the bottom surface portion is shorter than the long sides of the piezoelectric unit, and
the lower base of the bottom surface portion is longer than the long sides of the piezoelectric unit.

4. The vibration device according to claim 3,
wherein a distance between the lower base of the bottom surface portion and the long side of the piezoelectric unit along the lower base is shorter than short sides of the piezoelectric unit.

5. The vibration device according to claim 3,
wherein a first opening portion is formed on a lower base side of the bottom surface portion by not providing the side surface portion.

6. The vibration device according to claim 5,
wherein a second opening portion is formed on an upper base side of the bottom surface portion by cutting out a part of a top portion of the side surface portion.

7. The vibration device according to claim 6,
wherein an opening area of the first opening portion is larger than an opening area of the second opening portion.

8. The vibration device according to claim 1,
wherein a flange portion that is directed outward is provided on a top portion of each of the side surface portions.

9. The vibration device according to claim 8,
wherein a curvature radius of a connection portion between the side surface portion and the flange portion is smaller than a curvature radius of a connection portion between the bottom surface portion and the side surface portion.

10. A vibration device comprising:
a piezoelectric unit including a piezoelectric element; and
a housing made of metal that holds the piezoelectric unit,
wherein the housing includes a bottom surface portion to which the piezoelectric unit is fixed, and side surface portions that stand at an edge portion of the bottom surface portion to surround the piezoelectric unit, and the side surface portions are continuous with the bottom surface portion, and are inclined to open outward from the edge portion with respect to the bottom surface portion, wherein the piezoelectric unit has a rectangular shape in a plan view, the bottom surface portion has a trapezoidal shape of which an upper base and a lower base are sides corresponding to long sides of the piezoelectric unit in a plan view, the upper base of the bottom surface portion is shorter than the long sides of the piezoelectric unit, and the lower base of the bottom surface portion is longer than the long sides of the piezoelectric unit.

11. The vibration device according to claim 10, wherein both an inner surface and an outer surface of each of the side surface portions are inclined with respect to the bottom surface portion.

12. The vibration device according to claim 10, wherein a distance between the lower base of the bottom surface portion and the long side of the piezoelectric unit along the lower base is shorter than short sides of the piezoelectric unit.

13. The vibration device according to claim 10, wherein a first opening portion is formed on a lower base side of the bottom surface portion by not providing the side surface portion.

14. The vibration device according to claim 13, wherein a second opening portion is formed on an upper base side of the bottom surface portion by cutting out a part of a top portion of the side surface portion.

15. The vibration device according to claim 14, wherein an opening area of the first opening portion is larger than an opening area of the second opening portion.

16. The vibration device according to claim 10, wherein a flange portion that is directed outward is provided on a top portion of each of the side surface portions.

17. The vibration device according to claim 16, wherein a curvature radius of a connection portion between the side surface portion and the flange portion is smaller than a curvature radius of a connection portion between the bottom surface portion and the side surface portion.

* * * * *